(12) United States Patent
Wang et al.

(10) Patent No.: US 12,740,456 B2
(45) Date of Patent: Sep. 15, 2026

(54) STACKED WIRING STRUCTURE HAVING FIRST AND SECOND WIRING SUBSTRATE ELECTRICALLY CONNECTED BY FIRST AND SECOND CONDUCTIVE THROUGH VIAS

(71) Applicant: Industrial Technology Research Institute, Hsinchu (TW)

(72) Inventors: Tai-Jui Wang, Kaohsiung City (TW); Jui-Wen Yang, New Taipei City (TW); Chieh-Wei Feng, Taoyuan City (TW); Chih Wei Lu, Taoyuan City (TW); Hsien-Wei Chiu, Taoyuan City (TW)

(73) Assignee: Industrial Technology Research Institute, Hsinchu (TW)

( * ) Notice: Subject to any disclaimer, the term of this patent is extended or adjusted under 35 U.S.C. 154(b) by 394 days.

(21) Appl. No.: 18/452,566

(22) Filed: Aug. 21, 2023

(65) Prior Publication Data

US 2024/0088004 A1 Mar. 14, 2024

Related U.S. Application Data

(60) Provisional application No. 63/404,548, filed on Sep. 8, 2022.

(30) Foreign Application Priority Data

Jun. 19, 2023 (TW) ................................ 112123009

(51) Int. Cl.
*H10W 70/685* (2026.01)
*H10W 70/05* (2026.01)
(Continued)

(52) U.S. Cl.
CPC ....... *H10W 70/685* (2026.01); *H10W 70/095* (2026.01); *H10W 70/635* (2026.01);
(Continued)

(58) Field of Classification Search
CPC ............... H01L 23/49822; H01L 23/15; H01L 23/49816; H01L 23/49827;
(Continued)

(56) References Cited

U.S. PATENT DOCUMENTS 10,840,190 B1 * 11/2020 Yang .................. H01L 25/0657
2011/0004768 A1 1/2011 Cho et al.
(Continued)

FOREIGN PATENT DOCUMENTS

CN 104108679 10/2014
CN 112992828 6/2021
(Continued)

OTHER PUBLICATIONS

"Office Action of Taiwan Counterpart Application", issued on Jul. 29, 2024, p. 1-p. 8.
"Office Action of Taiwan Counterpart Application", issued on Jun. 12, 2026, p. 1-p. 12.

*Primary Examiner* — Michael Jung
(74) *Attorney, Agent, or Firm* — JCIPRNET

(57) ABSTRACT

A stacked wiring structure includes a first wiring substrate and a second wiring substrate. The first wiring substrate includes a first glass substrate, multiple first conductive through vias penetrating through the first glass substrate, and a first multi-layered redistribution wiring structure disposed on the first glass substrate. The second wiring substrate includes a second glass substrate, multiple second conductive through vias penetrating through the second glass substrate, and a second multi-layered redistribution wiring structure disposed on the second glass substrate. The first conductive through vias are electrically connected to the second conductive through vias. The first glass substrate is spaced apart from the second glass substrate. The first multi-layered redistribution wiring structure is spaced apart from the second multi-layered redistribution wiring struc-
(Continued)

ture by the first glass substrate and the second glass substrate.

16 Claims, 16 Drawing Sheets

(51) Int. Cl.
*H10W 70/63* (2026.01)
*H10W 70/65* (2026.01)
*H10W 70/692* (2026.01)
*H10W 90/00* (2026.01)

(52) U.S. Cl.
CPC ......... *H10W 70/65* (2026.01); *H10W 70/692* (2026.01); *H10W 90/701* (2026.01)

(58) Field of Classification Search
CPC .......... H01L 23/49838; H10W 70/685; H10W 90/701; H10W 70/095; H10W 70/635; H10W 70/65; H10W 70/692
See application file for complete search history.

(56) References Cited

U.S. PATENT DOCUMENTS

2020/0357734 A1 11/2020 Koga et al.
2021/0280505 A1* 9/2021 Huang .................... H01L 24/16
2022/0262783 A1 8/2022 Yu et al.
2023/0063304 A1* 3/2023 Liu ..................... H01L 21/4857
2023/0080454 A1* 3/2023 Pietambaram ....... G02B 6/4274 385/14
2023/0260945 A1* 8/2023 Wu ......................... H01L 24/20 257/737
2023/0378092 A1* 11/2023 Lai .......................... H01L 24/73
2024/0063100 A1* 2/2024 Marin ............... H01L 23/49811

FOREIGN PATENT DOCUMENTS

TW 201606979 2/2016
TW 201937688 9/2019
TW 202123412 6/2021
TW 202228267 7/2022

* cited by examiner 430
126
120
122
124
400
420
410
114
112
110
116
116a
116b
116
116a
130
122b
122a
112a
112b

STACKED WIRING STRUCTURE HAVING FIRST AND SECOND WIRING SUBSTRATE ELECTRICALLY CONNECTED BY FIRST AND SECOND CONDUCTIVE THROUGH VIAS

CROSS-REFERENCE TO RELATED APPLICATION

This application claims the priority benefit of the U.S. provisional application Ser. No. 63/404,548, filed on Sep. 8, 2022, and Taiwan application serial no. 112123009, filed on Jun. 19, 2023. The entirety of each of the above-mentioned patent applications is hereby incorporated by reference herein and made a part of this specification.

TECHNICAL FIELD

The disclosure relates to a stacked wiring structure and to a stacked wiring structure with a multi-layered redistribution wiring structure on both sides.

BACKGROUND

Glass packaging substrate, which is used to carry semiconductor chips (i.e., integrated circuits), has been widely employed in semiconductor chip packaging. Taking silicon chips as an example, glass packaging substrate has a thermal expansion coefficient that matches that of silicon chips. Moreover, the smooth surface of the glass packaging substrate contributes to high-frequency applications of silicon chips. Furthermore, glass packaging substrate has excellent dimensional stability and thermal conductivity. Generally, the thermal conductivity of glass packaging substrate is more than five times higher than that of bismaleimide triazine resin (BT) circuit boards. Glass packaging substrate, therefore, holds distinct advantages in the field of semiconductor chip packaging. However, existing glass packaging substrates still face challenges in effectively reducing manufacturing costs, and the production of large-area glass packaging substrates still encounters issues related to warping.

SUMMARY

The embodiment of this disclosure provides a stacked wiring structure, which may improve the warping of circuit structure and may reduce production costs.

One embodiment of the disclosure provides a stacked wiring structure including a first wiring substrate and a second wiring substrate. The first wiring substrate includes a first glass substrate, multiple first conductive through vias penetrating through the first glass substrate, and a first multi-layered redistribution wiring structure disposed on the first glass substrate. The second wiring substrate includes a second glass substrate, multiple second conductive through vias penetrating through the second glass substrate, and a second multi-layered redistribution wiring structure disposed on the second glass substrate. The first conductive through vias are electrically connected to the second conductive through vias. The first glass substrate is spaced apart from the second glass substrate. The first multi-layered redistribution wiring structure is spaced apart from the second multi-layered redistribution wiring structure by the first glass substrate and the second glass substrate.

Another embodiment of the disclosure provides a stacked wiring structure including a first wiring substrate and a second wiring substrate. The first wiring substrate includes an organic substrate, multiple conducting wires penetrating through the organic substrate, and a first multi-layered redistribution wiring structure disposed on the organic substrate. The second wiring substrate includes a glass substrate, multiple conductive through vias penetrating through the glass substrate, and a second multi-layered redistribution wiring structure disposed on the glass substrate. The conducting wires are electrically connected to the conductive through vias. The organic substrate is spaced apart from the glass substrate.

DETAILED DESCRIPTION OF DISCLOSURE EMBODIMENTS

Figure 1:
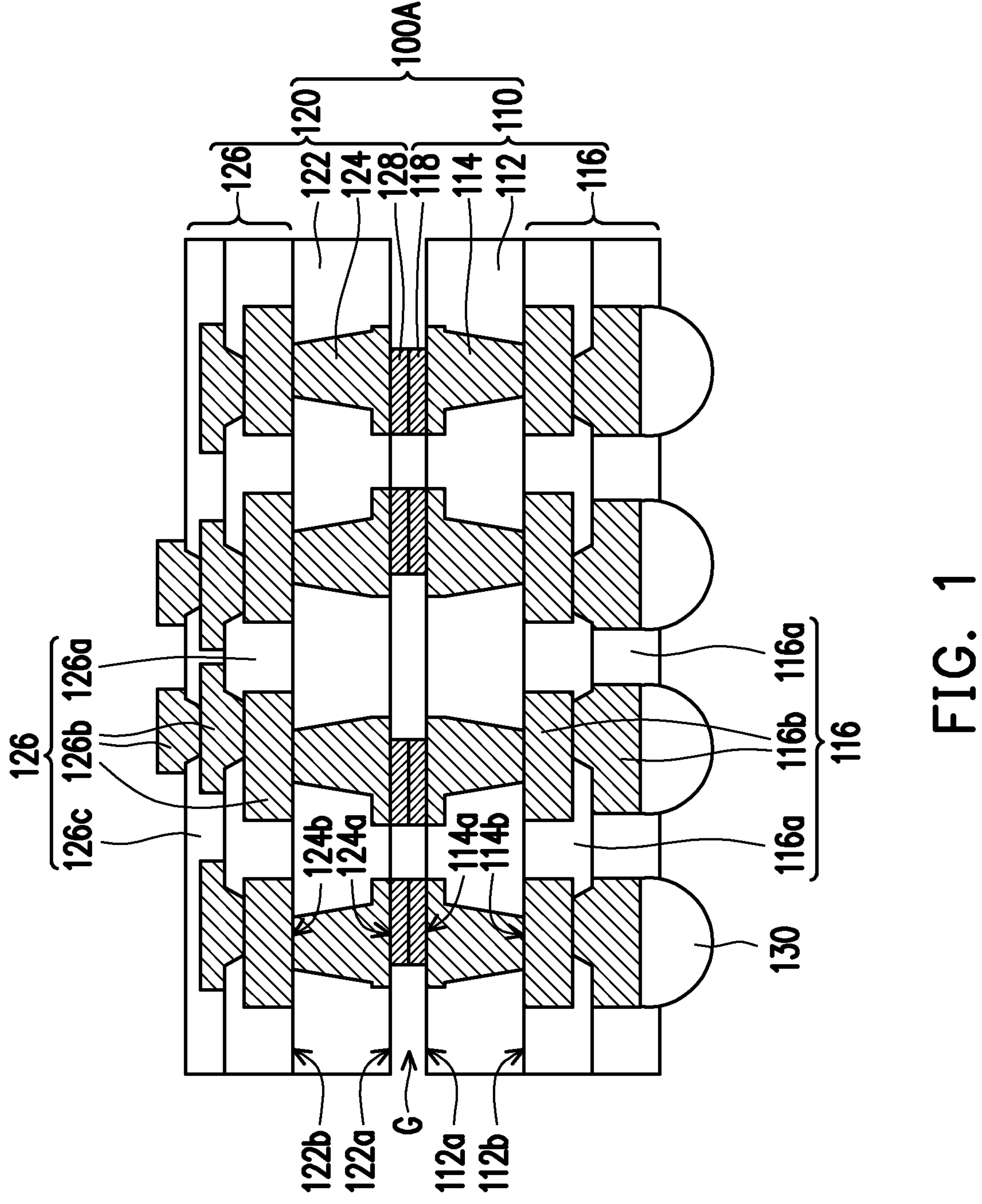
FIG. 1 to FIG. 16 are cross-sectional schematic views of a stacked wiring structure according to the first embodiment to the sixteenth embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout. In addition, the terms such as "including", "comprising", "having", etc. used in the text are all open-ended terms, that is, "including but not limited to". Furthermore, wordings used to indicate directions in the disclosure, such as "up," "down," "front," "back," "left," and "right," merely refer to directions in the accompanying drawings, and are not used to limit the disclosure. In addition, the numbers and shapes mentioned in the specification are only used to specifically illustrate the disclosure so as to facilitate understanding of its contents, rather than to limit the disclosure.

FIG. 1 to FIG. 16 are cross-sectional schematic views of a stacked wiring structure according to the first embodiment to the sixteenth embodiment of the disclosure.

The First Embodiment

Referring to FIG. 1, a stacked wiring structure 100A of this embodiment includes a first wiring substrate 110 and a second wiring substrate 120. The first wiring substrate 110 includes a first glass substrate 112, multiple first conductive through vias 114 penetrating through the first glass substrate 112, and a first multi-layered redistribution wiring structure 116 disposed on the first glass substrate 112. The second wiring substrate 120 includes a second glass substrate 122, multiple second conductive through vias 124 penetrating through the second glass substrate 122, and a second multi-layered redistribution wiring structure 126 disposed on the second glass substrate 122. The first conductive through vias 114 are electrically connected to the second conductive through vias 124. The first glass substrate 112 is spaced apart from the second glass substrate 122. The first multi-layered redistribution wiring structure 116 is spaced apart from the second multi-layered redistribution wiring structure 126 by the first glass substrate 112 and the second glass substrate 122. In this embodiment, the thickness of the first glass substrate 112 is, for example, between 0.1 mm and 1.5 mm, and the thickness of the second glass substrate 122 is, for example, between 0.1 mm and 1.5 mm. The thickness of the first glass substrate 112 and the thickness of the second glass substrate 122 may be the same or different.

In some embodiments, as shown in FIG. 1, the first wiring substrate 110 may further include multiple first pads 118, and the second wiring substrate 120 may further include multiple second pads 128. The first pads 118 are connected to the second pads 128, so that the first glass substrate 112 is spaced apart from the second glass substrate 122 by a gap G. In other words, the first glass substrate 112 is not in direct contact with the second glass substrate 122. In this embodiment, the first pads 118 include a copper pad and the second pads 128 include a copper pad, and there is a Cu—Cu bonding interface between the first pads 118 and the second pads 128. As shown in FIG. 1, the gap G between the first wiring substrate 110 and the second wiring substrate 120 is maintained by the first pads 118 and the second pads 128. In other words, the gap G between the first wiring substrate 110 and the second wiring substrate 120 is determined by the sum of the thicknesses of the first pads 118 and the second pads 128.

In this embodiment, the first glass substrate 112 of the first wiring substrate 110 has a first inner surface 112*a* facing the second wiring substrate 120 and a first outer surface 112*b* opposite to the first inner surface 112*a*, and the second glass substrate 122 of the second wiring substrate 120 has a second inner surface 122*a* facing the first wiring substrate 110 and a second outer surface 122*b* opposite to the second inner surface 122*a*. It may be seen from FIG. 1 that the first inner surface 112*a* of the first wiring substrate 110 and the second inner surface 122*a* of the second wiring substrate 120 are located between the first outer surface 112*b* of the first wiring substrate 110 and the second outer surface 122*b* of the second wiring substrate 120.

In this embodiment, one of the surfaces 114*a* (e.g., a top surface) of the first conductive through vias 114 is substantially coplanar with the first inner surface 112*a* of the first glass substrate 112. Another surface 114*b* (e.g., a bottom surface) of the first conductive through vias 114 is substantially coplanar with the first outer surface 112*b* of the first glass substrate 112. One of the surfaces 124*a* (e.g., a bottom surface) of the second conductive through vias 124 is substantially coplanar with the second inner surface 122*a* of the second glass substrate 122. Another surface 124*b* (e.g., a top surface) of the second conductive through vias 124 is substantially coplanar with the second outer surface 122*b* of the second glass substrate 122.

As shown in FIG. 1, the first multi-layered redistribution wiring structure 116 includes multiple first dielectric layers 116*a* and multiple first redistribution conducting wires 116*b* between the first dielectric layers 116*a*, and the second multi-layered redistribution wiring structure 126 includes at least one second dielectric layer 126*a*, multiple second redistribution conducting wires 126*b*, and a flat layer 126*c* covering the second dielectric layer 126*a* and the second redistribution conducting wires 126*b*. In this embodiment, the first multi-layered redistribution wiring structure 116 may include more than six layers of first redistribution conducting wires 116*b*, and the second multi-layered redistribution wiring structure 126 may include more than six layers of second redistribution conducting wires 126*b*. However, the disclosure does not limit the number of layers of the first redistribution conducting wires 116*b* and the second redistribution conducting wires 126*b*.

The aforementioned first redistribution conducting wires 116*b* and second redistribution conducting wires 126*b* may be copper conducting wires. Each of the aforementioned first dielectric layers 116*a* and second dielectric layer 126*a* may be an Ajinomoto build-up film (ABF) whose thickness is between 5 micrometers and 30 micrometers. The flat layer 126*c* may be an acrylic material whose thickness is between 2 micrometers and 10 micrometers.

In this embodiment, the outermost layer of the first redistribution conducting wires 116*b* in the first multi-layered redistribution wiring structure 116 may include an external pad for disposing of an external conductive terminal 130, and the outermost layer of the second redistribution conducting wires 126*b* in the second multi-layered redistribution wiring structure 126 may include a chip pad for bonding with a semiconductor chip (not shown). In this embodiment, the external conductive terminal 130 may be BGA balls or other types of conductive terminal, and the external pad for disposing of the external conductive terminal 130 may be a under bump metallurgy with a multi-layer metal stacked structure.

In this embodiment, the aforementioned stacked wiring structure 100A is a panel level wiring substrate, and the stacked wiring structure 100A is a rectangle circuit substrate. In some embodiments, the short side of the stacked wiring structure 100A is, for example, 37 cm, and the long side of the stacked wiring structure 100A is, for example, 47 cm. In some other embodiments, the short side of the stacked wiring structure 100A is, for example, 62 cm, and the long side of the stacked wiring structure 100A is, for example, 75 cm.

The Second Embodiment

Figure 2:
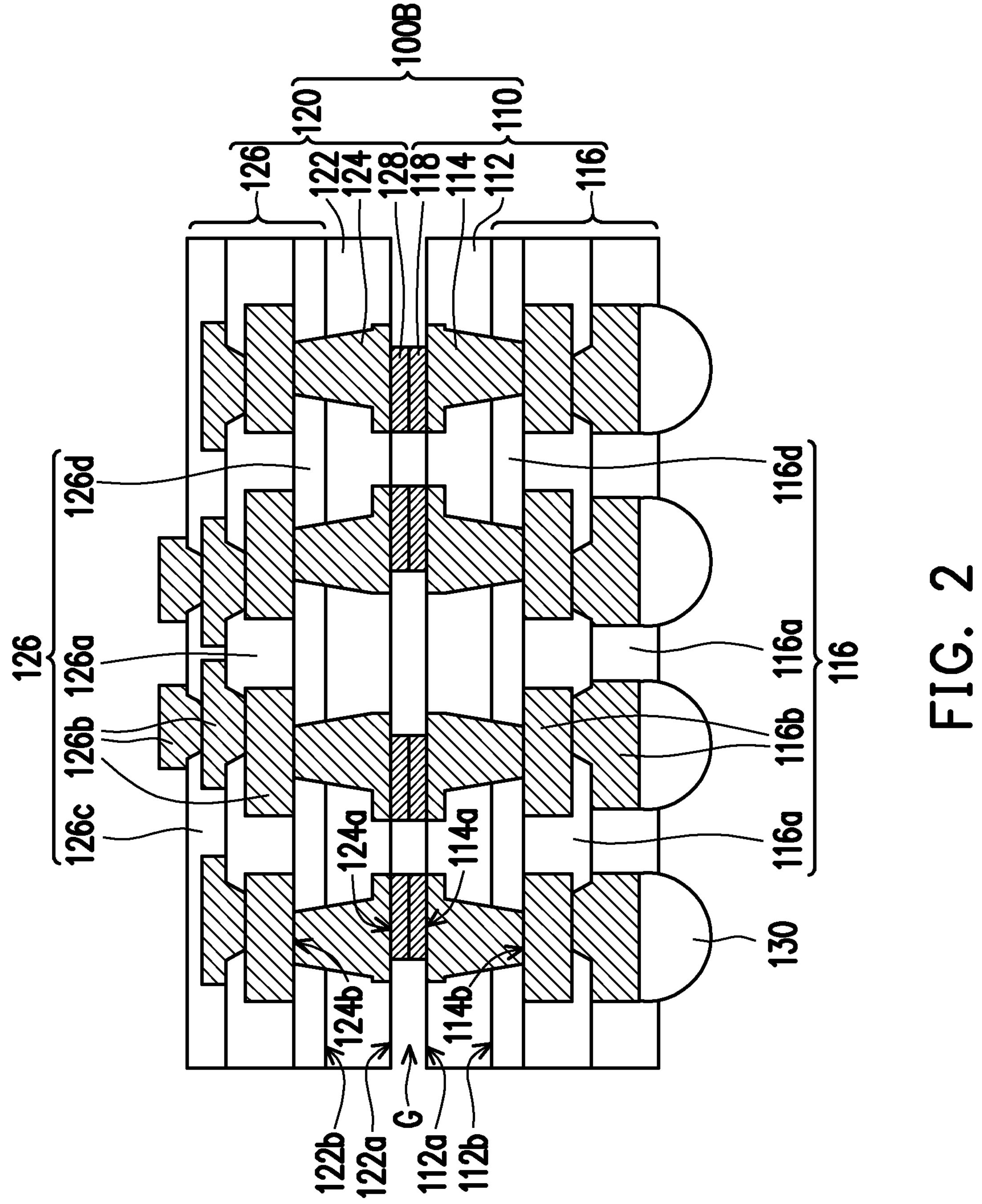

Referring to FIG. 2, a stacked wiring structure 100B of this embodiment is similar to the stacked wiring structure 100A of the first embodiment, but the main differences between the two are: the first multi-layered redistribution wiring structure 116 further includes a first etch stop layer 116*d*, and the first etch stop layer 116*d* is disposed between the first dielectric layers 116*a* and the first glass substrate 112, while the second multi-layered redistribution wiring structure 126 further includes a second etch stop layer 126*d*, and the second etch stop layer 126*d* is disposed between the second dielectric layer 126*a* and the second glass substrate 122. For example, materials of the aforementioned first etch stop layer 116*d* and second etch stop layer 126*d* include silicon nitride with a thickness ranging from 100 nanometers to 1000 nanometers or acrylic material with a thickness ranging from 2 micrometers to 5 micrometers.

In this embodiment, the first conductive through vias 114 penetrate through the first glass substrate 112 and the first etch stop layer 116*d*, and the second conductive through vias 124 penetrate through the second glass substrate 122 and the second etch stop layer 126*d*. In addition, as shown in FIG. 2, one of the surfaces 114*b* (e.g., a bottom surface) of the first conductive through vias 114 is substantially coplanar with one of the surfaces of the first etch stop layer 116*d*. Another surface 114*a* (e.g., a top surface) of the first conductive through vias 114 is substantially coplanar with the first inner surface 112*a* of the first glass substrate 112. One of the surfaces 124*b* (e.g., a top surface) of the second conductive through vias 124 is substantially coplanar with one of the surfaces of the second etch stop layer 126*d*. Another surface 124*a* (e.g., a bottom surface) of the second conductive through vias 124 is substantially coplanar with the second outer surface 112*b* of the second glass substrate 122.

The Third Embodiment

Figure 3:
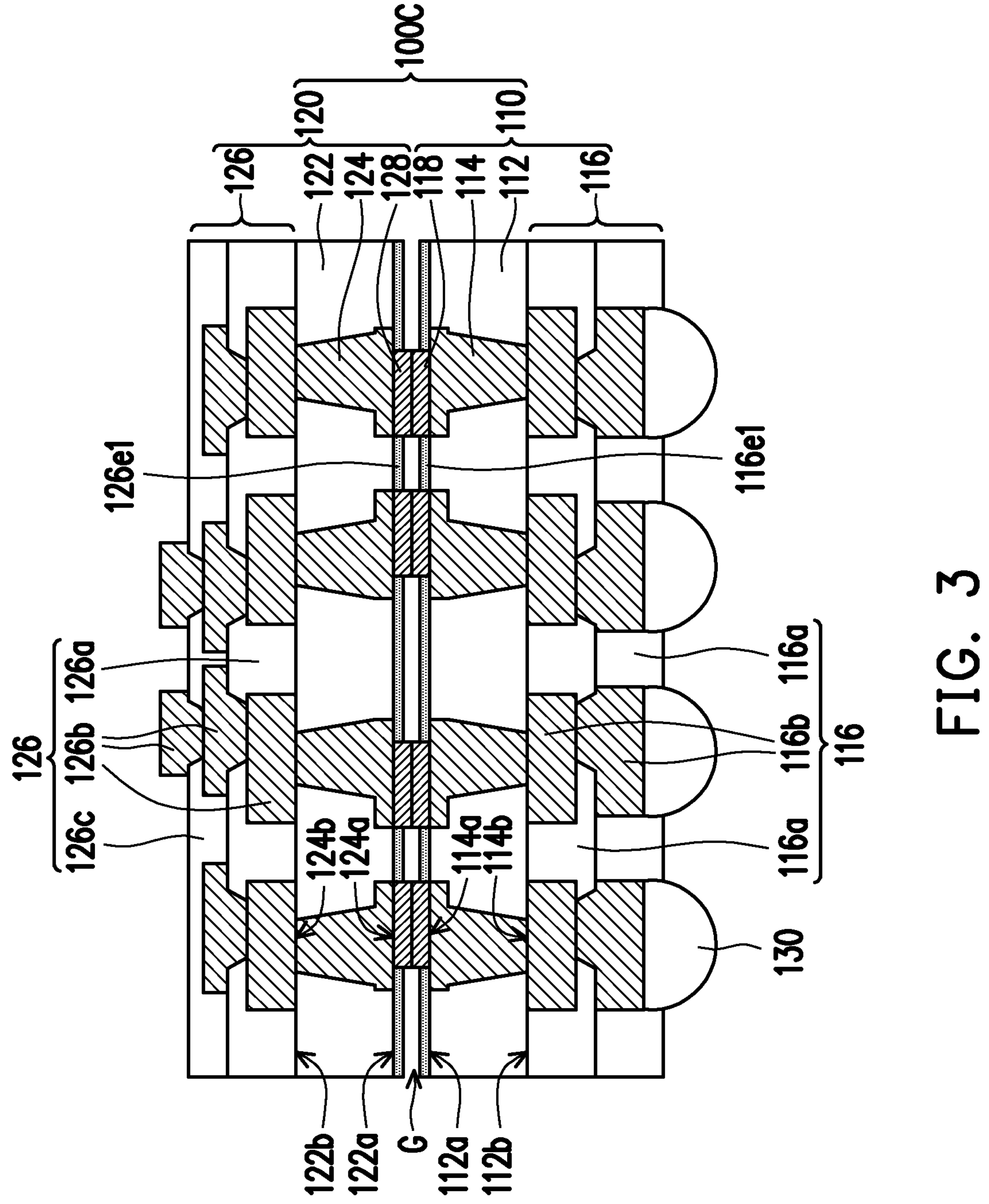

Referring to FIG. 3, a stacked wiring structure 100C of this embodiment is similar to the stacked wiring structure 100A of the first embodiment, but the main differences between the two are: the first multi-layered redistribution wiring structure 116 further includes a first stress control layer **116*e*1, and the second multi-layered redistribution wiring structure 126 further includes a second stress control layer 126*e*1. The first stress control layer 116*e*1 is disposed on the first glass substrate 112, and the second stress control layer 126*e*1 is disposed on the second glass substrate 122. For example, the first stress control layer 116*e*1 covers the first inner surface 112*a* of the first glass substrate 112, and the second stress control layer 126*e*1 covers the second inner surface 122*a* of the second glass substrate 122. In addition, the first stress control layer 116*e*1 is spaced apart from the second stress control layer 126*e*1**.

In some embodiments, the first stress control layer **116*e*1 and the second stress control layer 126*e*1 include silicon oxide layer, silicon nitride layer, silicon oxynitride layer, aluminum oxide layer, or magnesium oxide layer formed by chemical vapor deposition or physical vapor deposition with a thickness ranging from 100 nanometers to 1000 nanometers. In some other embodiments, the first stress control layer 116*e*1 and the second stress control layer 126*e*1 include PSPI layer, PBO layer, or acrylic material layer formed by coating. In addition, the first stress control layer 116*e*1 may be in contact with the side wall of the first pads 118, and the second stress control layer 126*e*1 may be in contact with the side wall of the second pads 128**.

The Fourth Embodiment

Figure 4:
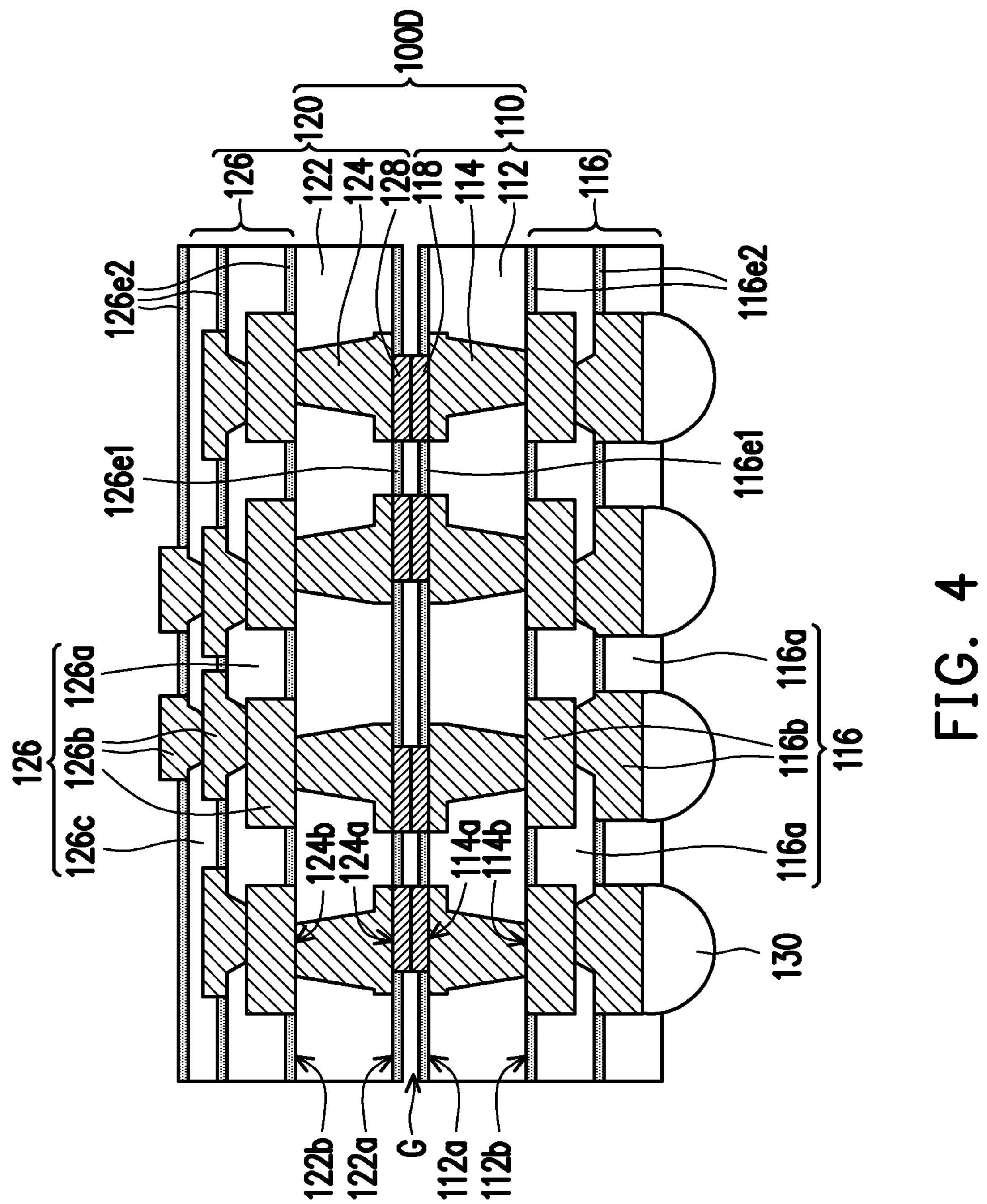

Referring to FIG. 4, a stacked wiring structure 100D of this embodiment is similar to the stacked wiring structure 100C of the third embodiment, but the main differences between the two are: the first multi-layered redistribution wiring structure 116 further includes a first stress control layer **116*e*2, and the second multi-layered redistribution wiring structure 126 further includes a second stress control layer 126*e*2. The first stress control layer 116*e*2 is disposed in the first multi-layered redistribution wiring structure 116 and on the outer surface of the first multi-layered redistribution wiring structure 116. The second stress control layer 126*e*2 is disposed in the second multi-layered redistribution wiring structure 126 and on the outer surface of the second multi-layered redistribution wiring structure 126. For example, the first stress control layer 116*e*2 may be disposed between the first glass substrate 112 and the first multi-layered redistribution wiring structure 116 and/or in the first multi-layered redistribution wiring structure 116, and the second stress control layer 126*e*2 may be disposed between the second glass substrate 122 and the second multi-layered redistribution wiring structure 126, in the second multi-layered redistribution wiring structure 126, and/or on the outer surface of the flat layer 126*c*. In addition, the first stress control layer 116*e*1, the second stress control layer 126*e*1, the first stress control layer 116*e*2, and the second stress control layer 126*e*2** are spaced apart from each other.

In some embodiments, the first stress control layers **116*e*1 and 116*e*2 and the second stress control layers 126*e*1 and 126*e*2 include silicon oxide layer, silicon nitride layer, silicon oxynitride layer, aluminum oxide layer, or magnesium oxide layer formed by chemical vapor deposition or physical vapor deposition with a thickness ranging from 100 nanometers to 1000 nanometers. In some other embodiments, the first stress control layers 116*e*1 and 116*e*2 and the second stress control layers 126*e*1 and 126*e*2** include PSPI layer, PBO layer, or acrylic material layer formed by coating.

The Fifth Embodiment

Figure 5:
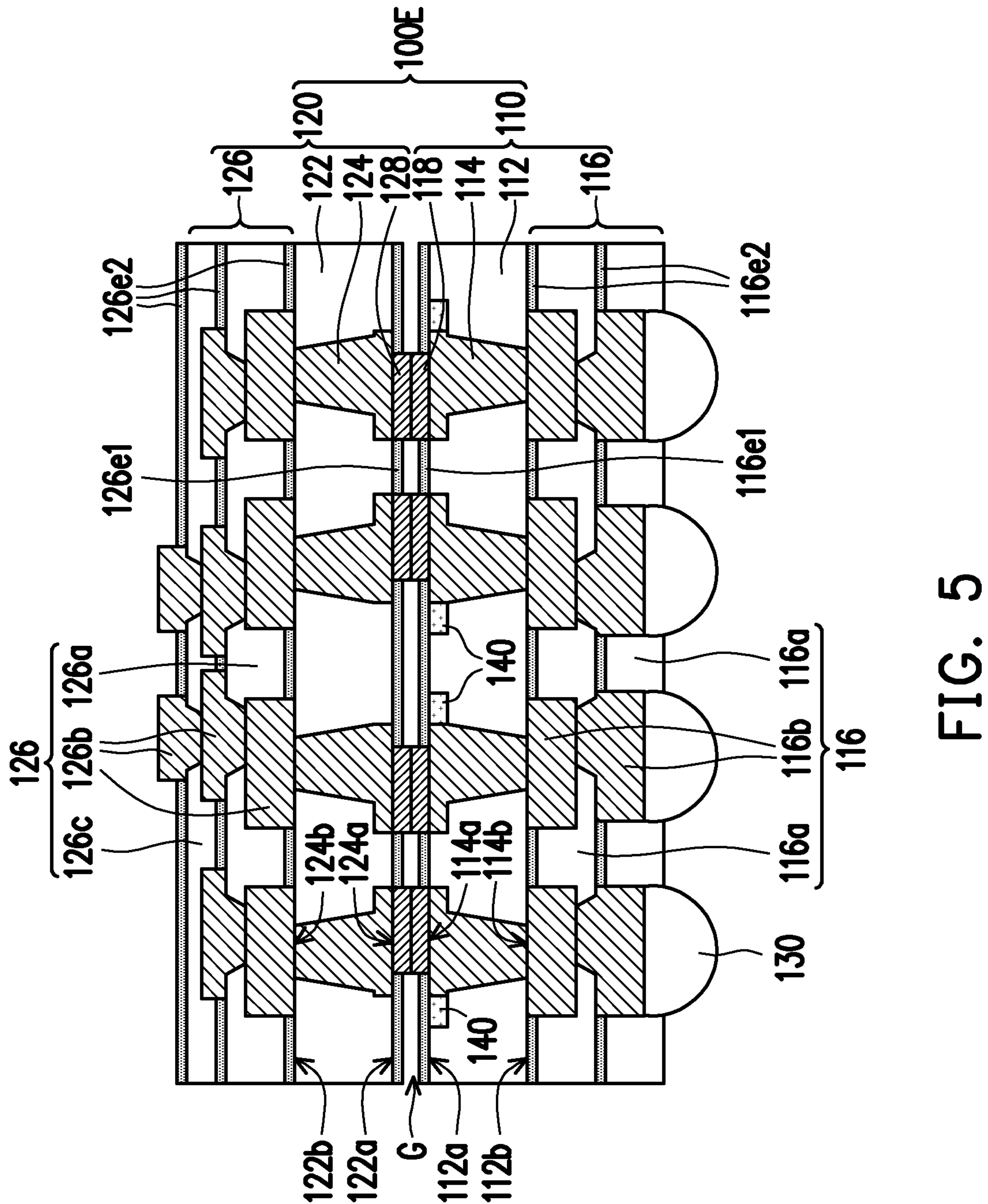

Referring to FIG. 5, a stacked wiring structure 100E of this embodiment is similar to the stacked wiring structure 100D of the fourth embodiment, but the main differences between the two are: the stacked wiring structure 100E further includes a heater 140. The heater 140 is disposed in the first wiring substrate 110. As shown in FIG. 5, the heater 140 may be embedded in the first glass substrate 112. In this embodiment, the heater 140 includes a micro-heater distributed in the first glass substrate 112 near the first stress control layer **116*e*1. In addition, the heater 140 may or may not be in contact with the first stress control layer 116*e*1**.

The Sixth Embodiment

Figure 6:
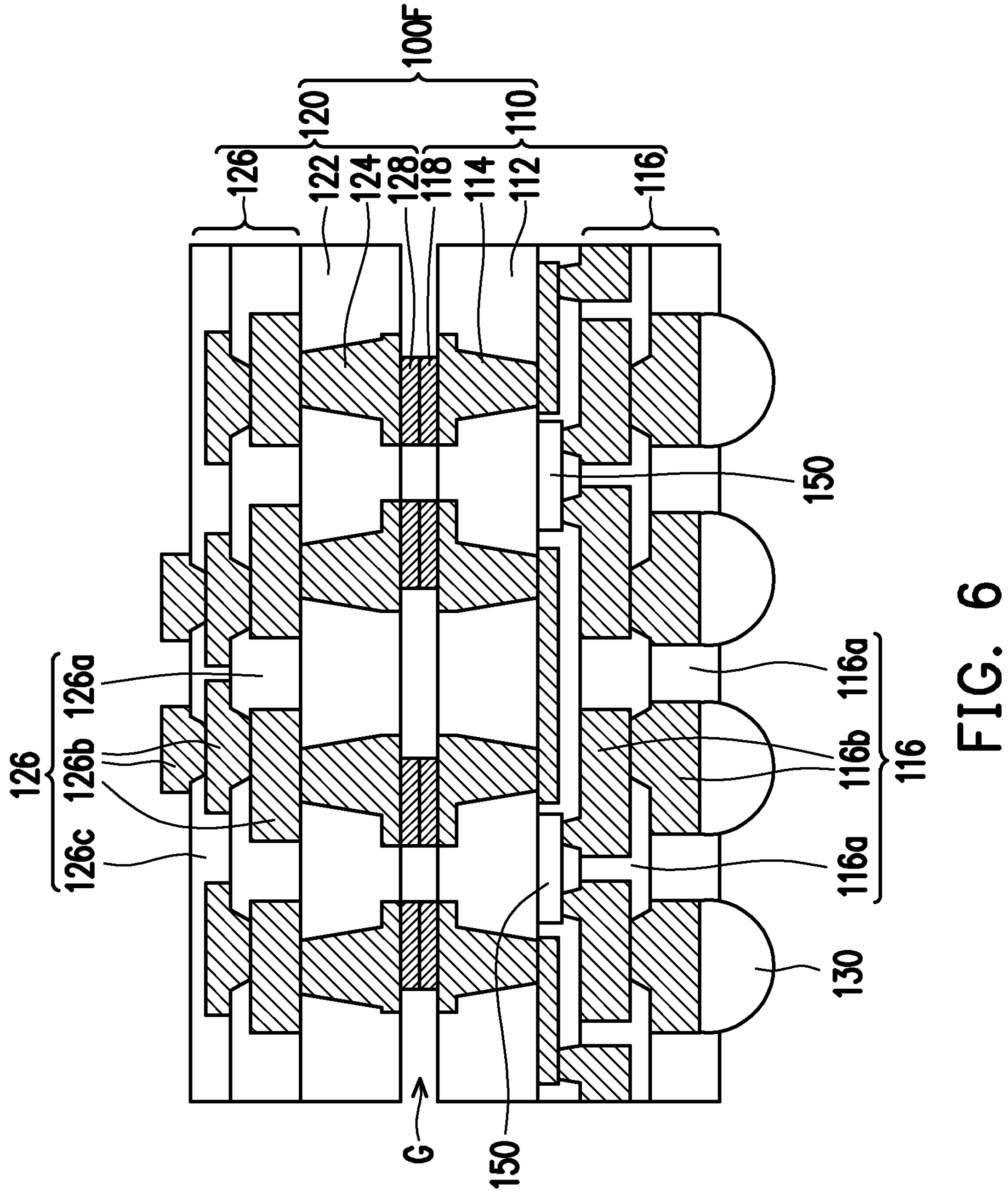

Referring to FIG. 6, a stacked wiring structure 100F of this embodiment is similar to the stacked wiring structure 100A of the first embodiment, but the main differences between the two are: the stacked wiring structure 100F further includes a passive device 150. The passive device 150 is disposed in the first wiring substrate 110. As shown in FIG. 6, the passive device 150 may be embedded in the first dielectric layers **116*a*. In this embodiment, the passive device 150 includes an integrated passive device (IPD) distributed in the first dielectric layers 116*a* near the first glass substrate 112. In addition, the passive device 150 may or may not be in contact with first glass substrate 112**.

The Seventh Embodiment

Figure 7:
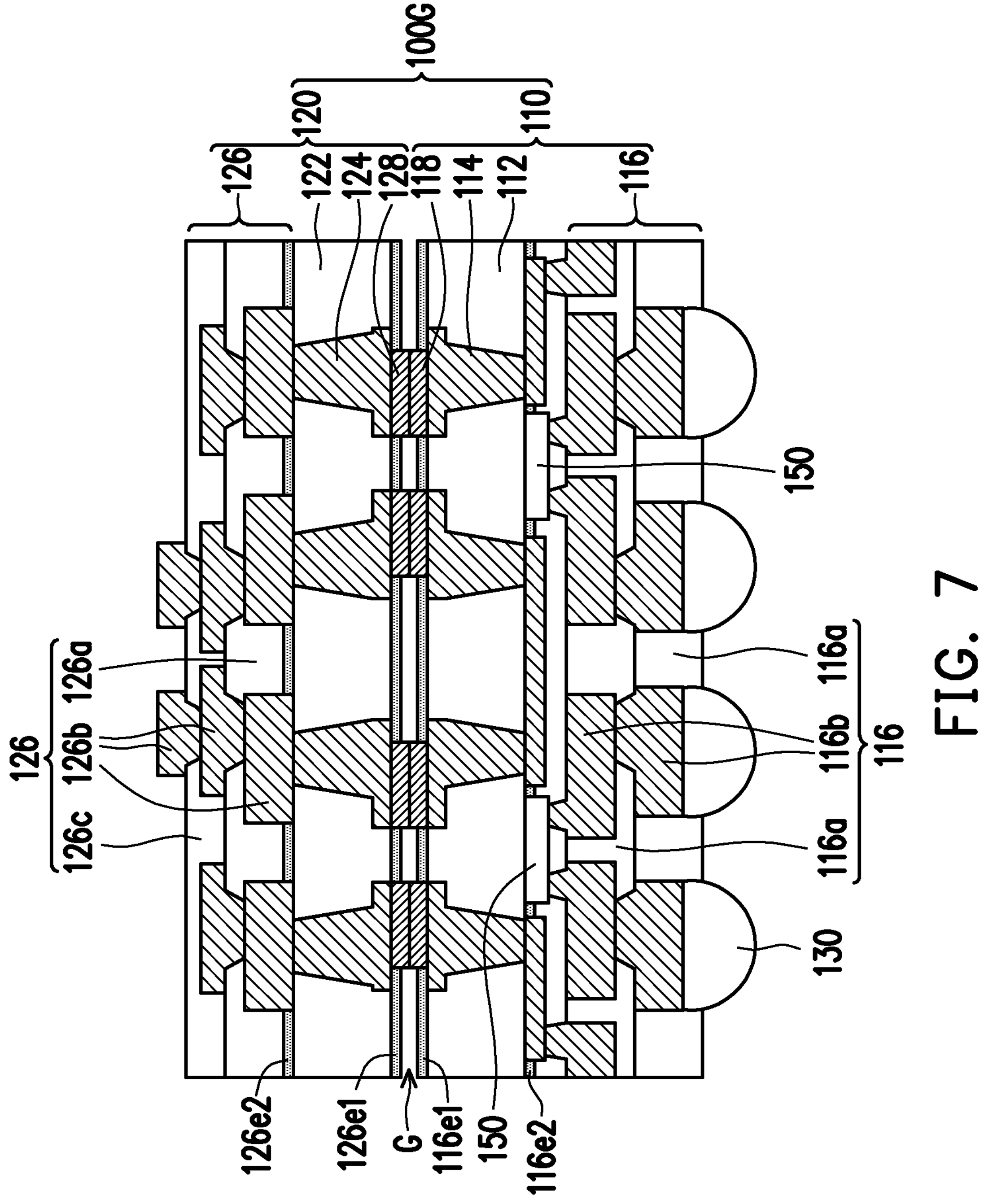

Referring to FIG. 7, a stacked wiring structure 100G of this embodiment is similar to the stacked wiring structure 100D of the fourth embodiment, but the main differences between the two are: the stacked wiring structure 100G further includes a passive device 150. The passive device 150 is disposed in the first wiring substrate 110. As shown in FIG. 7, the passive device 150 may be embedded in the first dielectric layers **116*a*. In this embodiment, the passive device 150 includes an integrated passive device (IPD) distributed in the first dielectric layers 116*a* near the first glass substrate 112. In addition, the passive device 150 may be in contact with the first glass substrate 112 and the first stress control layer 116*e*2. In other embodiments, which are not shown in the figure, the passive device 150 may not be in contact with the first glass substrate 112 and the first stress control layer 116*e*2**.

The Eighth Embodiment

Figure 8:
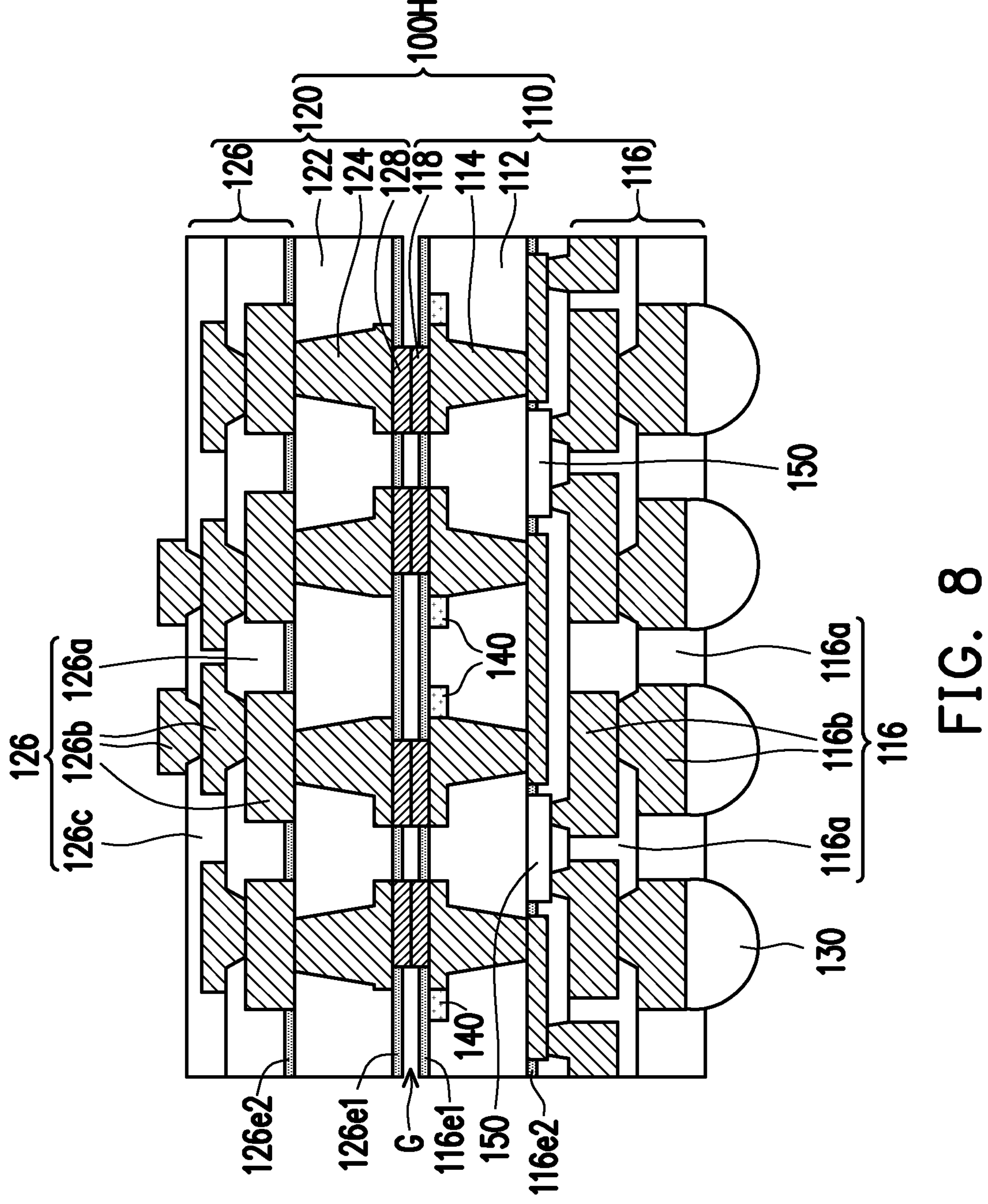

Referring to FIG. 8, a stacked wiring structure 100H of this embodiment is similar to the stacked wiring structure 100G of the seventh embodiment, but the main differences between the two are: the stacked wiring structure 100H further includes a heater 140. The heater 140 is disposed in the first wiring substrate 110. As shown in FIG. 8, the heater 140 may be embedded in the first glass substrate 112. In this embodiment, the heater 140 includes a micro-heater distributed in the first glass substrate 112 near the first stress control layer **116*e*1. In addition, the heater 140 may or may not be in contact with the first stress control layer 116*e*1**.

The Ninth Embodiment

Figure 9:
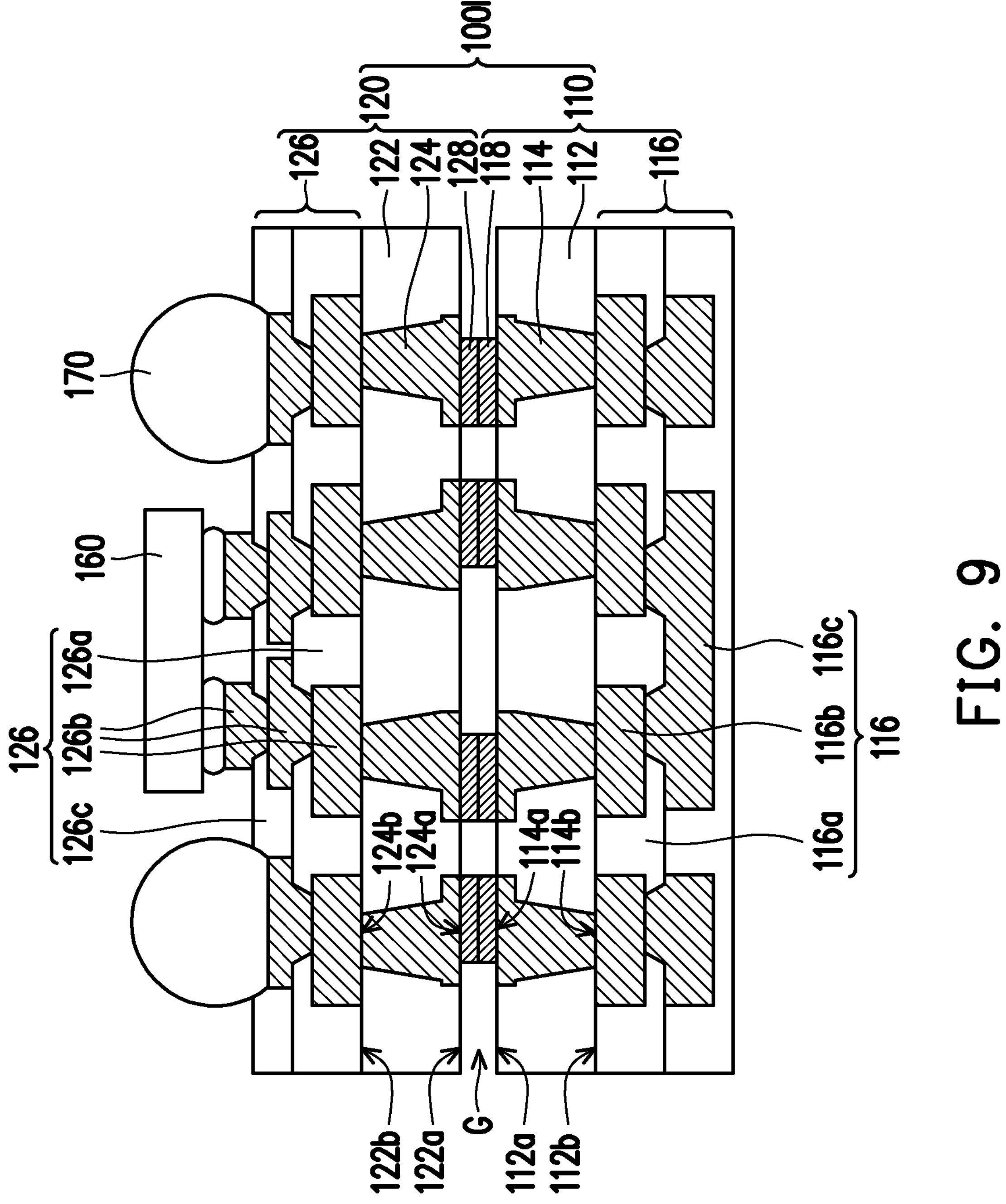

Referring to FIG. 9, a stacked wiring structure 100I of this embodiment is similar to the stacked wiring structure 100A of the first embodiment, but the main differences between the two are: the stacked wiring structure 100I of this embodiment further includes a control chip 160 disposed on the second multi-layered redistribution wiring structure 126. The first multi-layered redistribution wiring structure 116 further includes an antenna 116*c*, this antenna 116*c* may be a transparent antenna. The antenna 116*c* is disposed between the first dielectric layers 116*a*, and the manufacture of the antenna 116*c* is integrated into the manufacture of the first redistribution conducting wires 116*b*.

In addition, the stacked wiring structure 100I further includes an external conductive terminal 170 but does not include the external conductive terminal 130. The external conductive terminal 170 is disposed on the second multi-layered redistribution wiring structure 126 and is electrically connected to the second multi-layered redistribution wiring structure 126. In this embodiment, the control chip 160 and the external conductive terminal 170 are disposed on the same side of the second multi-layered redistribution wiring structure 126.

The Tenth Embodiment

Figure 10:
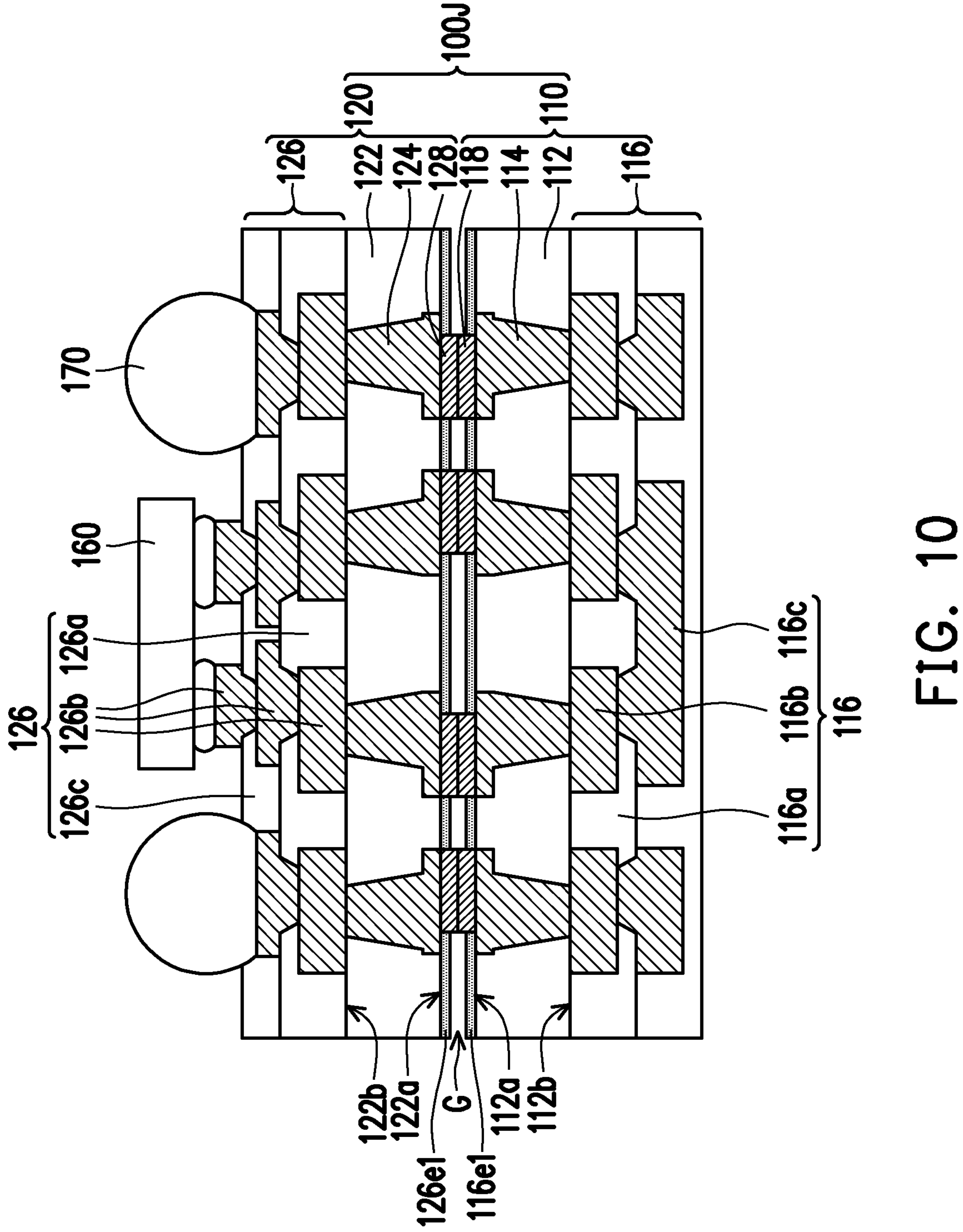

Referring to FIG. 10, a stacked wiring structure 100J of this embodiment is similar to the stacked wiring structure 100I of the ninth embodiment, but the main differences between the two are: the first multi-layered redistribution wiring structure 116 further includes a first stress control layer 116*e*1, and the second multi-layered redistribution wiring structure 126 further includes a second stress control layer 126*e*1. The first stress control layer 116*e*1 is disposed on the first glass substrate 112, and the second stress control layer 126*e*1 is disposed on the second glass substrate 122. For example, the first stress control layer 116*e*1 covers the first inner surface 112*a* of the first glass substrate 112, and the second stress control layer 126*e*1 covers the second inner surface 122*a* of the second glass substrate 122. In addition, the first stress control layer 116*e*1 is spaced apart from the second stress control layer 126*e*1.

In some embodiments, the first stress control layer 116*e*1 and the second stress control layer 126*e*1 include silicon oxide layer, silicon nitride layer, silicon oxynitride layer, aluminum oxide layer, or magnesium oxide layer formed by chemical vapor deposition or physical vapor deposition with a thickness ranging from 100 nanometers to 1000 nanometers. In some other embodiments, the first stress control layer 116*e*1 and the second stress control layer 126*e*1 include PSPI layer, PBO layer, or acrylic material layer formed by coating. In addition, the first stress control layer 116*e*1 may be in contact with the side wall of the first pads 118, and the second stress control layer 126*e*1 may be in contact with the side wall of the second pads 128.

The Eleventh Embodiment

Figure 11:
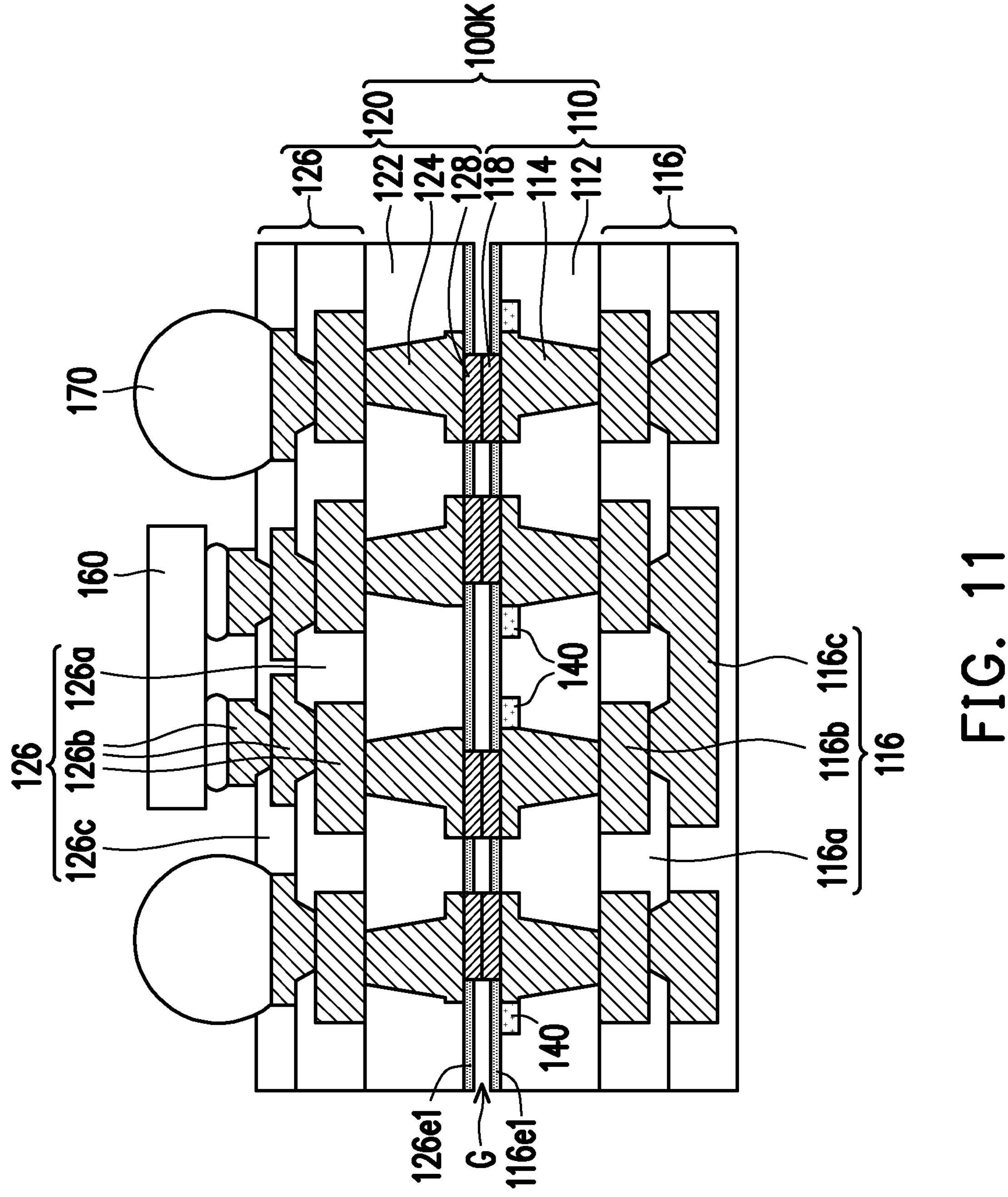

Referring to FIG. 11, a stacked wiring structure 100K of this embodiment is similar to the stacked wiring structure 100J of the tenth embodiment, but the main differences between the two are: the stacked wiring structure 100K further includes a heater 140. The heater 140 is disposed in the first wiring substrate 110. As shown in FIG. 11, the heater 140 may be embedded in the first glass substrate 112. In this embodiment, the heater 140 includes a micro-heater distributed in the first glass substrate 112 near the first stress control layer 116*e*1. In addition, the heater 140 may or may not be in contact with the first stress control layer 116*e*1.

The Twelfth Embodiment

Figure 12:
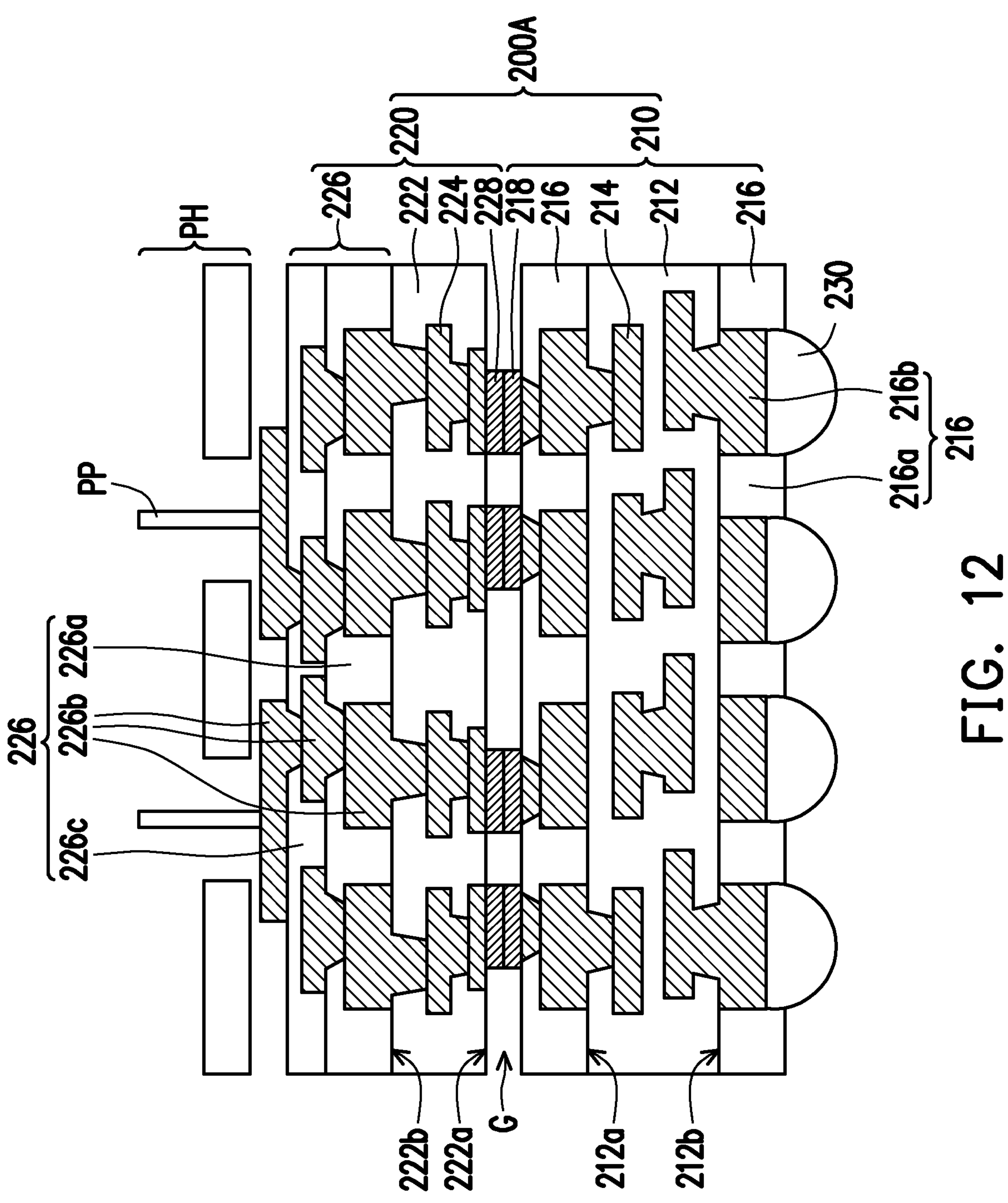

Referring to FIG. 12, a stacked wiring structure 200A of this embodiment includes a first wiring substrate 210 and a second wiring substrate 220. The first wiring substrate 210 includes an organic substrate 212, multiple conducting wires 214 located in the organic substrate 212, and a first multi-layered redistribution wiring structure 216 disposed on the organic substrate 212. The second wiring substrate 220 includes a glass substrate 222, multiple conductive through vias 224 penetrating through the glass substrate 222, and a second multi-layered redistribution wiring structure 226 disposed on the glass substrate 222. The conducting wires 214 are electrically connected to the conductive through vias 224. The organic substrate 212 is spaced apart from the glass substrate 222. In this embodiment, the first multi-layered redistribution wiring structure 216 is spaced apart from the second multi-layered redistribution wiring structure 226 by the organic substrate 212 and the glass substrate 222. For example, the thickness of the organic substrate 212 is between 0.2 mm and 1.5 mm, and the thickness of the glass substrate 222 is, for example, between 0.1 mm and 1.5 mm. The thickness of the organic substrate 212 and the thickness of the glass substrate 222 may be the same or different.

In some embodiments, as shown in FIG. 12, the first wiring substrate 210 may further include multiple first pads 218, and the second wiring substrate 220 may further include multiple second pads 228. The first pads 218 are connected to the second pads 228, so that the organic substrate 212 is spaced apart from the glass substrate 222 by a gap G. In other words, the organic substrate 212 is not in direct contact with the glass substrate 222. In this embodiment, the first pads 218 include a copper pad and the second pads 228 include a copper pad, and there is a Cu—Cu bonding interface between the first pads 218 and the second pads 228. As shown in FIG. 12, the gap G between the first wiring substrate 210 and the second wiring substrate 220 is maintained by the first pads 218 and the second pads 228. In other words, the gap G between the first wiring substrate 210 and the second wiring substrate 220 is determined by the sum of the thicknesses of the first pads 218 and the second pads 228.

In this embodiment, the organic substrate 212 of the first wiring substrate 210 has a first inner surface 212*a* facing the second wiring substrate 220 and a first outer surface 212*b* opposite to the first inner surface 212*a*, and the glass substrate 222 of the second wiring substrate 220 has a second inner surface 222*a* facing the first wiring substrate 210 and a second outer surface 222*b* opposite to the second inner surface 222*a*. It may be seen from FIG. 12 that the first inner surface 212*a* of the first wiring substrate 210 and the second inner surface 222*a* of the second wiring substrate 220 are located between the first outer surface 212*b* of the first wiring substrate 210 and the second outer surface 222*b* of the second wiring substrate 220.

In this embodiment, the conducting wires 214 are embedded in the organic substrate 212, and the conductive through vias 224 are embedded in the glass substrate 222. In other words, the top surface and the bottom surface of the conducting wires 214 are not coplanar with the surface of the organic substrate 212, and the top surface and the bottom surface of the conductive through vias 224 are not coplanar with the surface of the glass substrate 222.

As shown in FIG. 12, the first multi-layered redistribution wiring structure 216 includes a first dielectric layer 216*a* and multiple first redistribution conducting wires 216*b* in the first dielectric layer 216*a*. The second multi-layered redistribution wiring structure 226 includes at least one second dielectric layer 226*a*, multiple redistribution conducting wires 226*b*, and a flat layer 226*c* covering the second dielectric layer 226*a* and the redistribution conducting wires 226*b*. In this embodiment, the first multi-layered redistribution wiring structure 216 may include at least one layer of the first redistribution conducting wires 116*b*, and the second multi-layered redistribution wiring structure 226 may include more than six layers of the redistribution conducting wires 226*b*. However, the disclosure does not limit the number of layers of the first redistribution conducting wires 216*b* and the second redistribution conducting wires 226*b*.

The aforementioned first redistribution conducting wires 216*b* and second redistribution conducting wires 226*b* may be copper conducting wires. Each of the aforementioned first dielectric layer 216*a* and second dielectric layer 226*a* may be an Ajinomoto build-up film (ABF) whose thickness is between 5 micrometers and 30 micrometers. The flat layer 226*c* may be an acrylic material whose thickness is between 5 micrometers and 40 micrometers.

In this embodiment, the stacked wiring structure 200A further includes a probe head PH with a probe PP. The probe head PH is disposed above the second wiring substrate 220. The probe PP of the probe head PH is electrically connected to the second multi-layered redistribution wiring structure 226 below. As shown in FIG. 12, the outermost layer of the second redistribution conducting wires 226*b* in the second multi-layered redistribution wiring structure 226 may include a pad for contacting and electrically connecting with the probe PP. The outermost layer of the first redistribution conducting wires 216*b* in the first multi-layered redistribution wiring structure 216 may include an external pad for disposing of an external conductive terminal 230. In this embodiment, the external conductive terminal 230 may be BGA balls or other types of conductive terminal, and the external pad for disposing of the external conductive terminal 230 may be a under bump metallurgy with a multi-layer metal stacked structure.

In this embodiment, the aforementioned stacked wiring structure 200A is a panel level wiring substrate, and the stacked wiring structure 200A is a rectangle circuit substrate. In some embodiments, the short side of the stacked wiring structure 200A is, for example, 37 cm, and the long side of the stacked wiring structure 200A is, for example, 47 cm. In some other embodiments, the short side of the stacked wiring structure 200A is, for example, 62 cm, and the long side of the stacked wiring structure 200A is, for example, 75 cm.

The Thirteenth Embodiment

Figure 13:
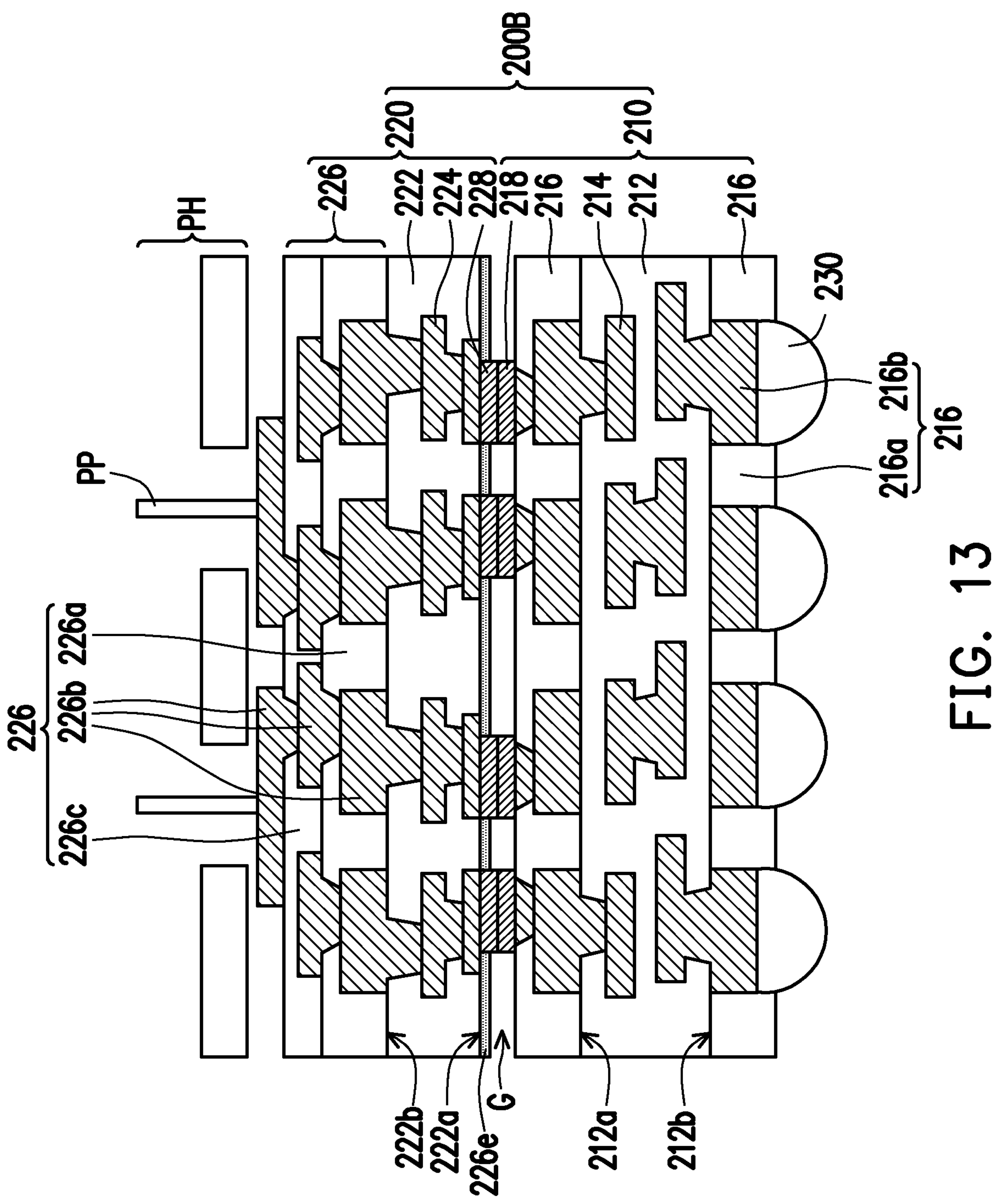

Referring to FIG. 13, a stacked wiring structure 200B of this embodiment is similar to the stacked wiring structure 200A of the twelfth embodiment, but the main differences between the two are: the second multi-layered redistribution wiring structure 220 in the stacked wiring structure 200B further includes a stress control layer 226*e*, and the stress control layer 226*e* covers the inner surface 222*a* of the glass substrate 222. In addition, as shown in FIG. 13, the stress control layer 226*e* may be in contact with the side wall of the second pads 228.

In other feasible embodiments, which not shown in the figure, the stress control layer 226*e* is disposed in the second multi-layered redistribution wiring structure 226 and/or on the surface of the second multi-layered redistribution wiring structure 226.

In some embodiments, the stress control layer 226*e* includes silicon oxide layer, silicon nitride layer, silicon oxynitride layer, aluminum oxide layer, or magnesium oxide layer formed by chemical vapor deposition or physical vapor deposition with a thickness ranging from 100 nanometers to 1000 nanometers. In some other embodiments, the stress control layer 226*e* includes a PSPI layer, a PBO layer, or an acrylic material layer formed by coating.

The Fourteenth Embodiment

Figure 14:
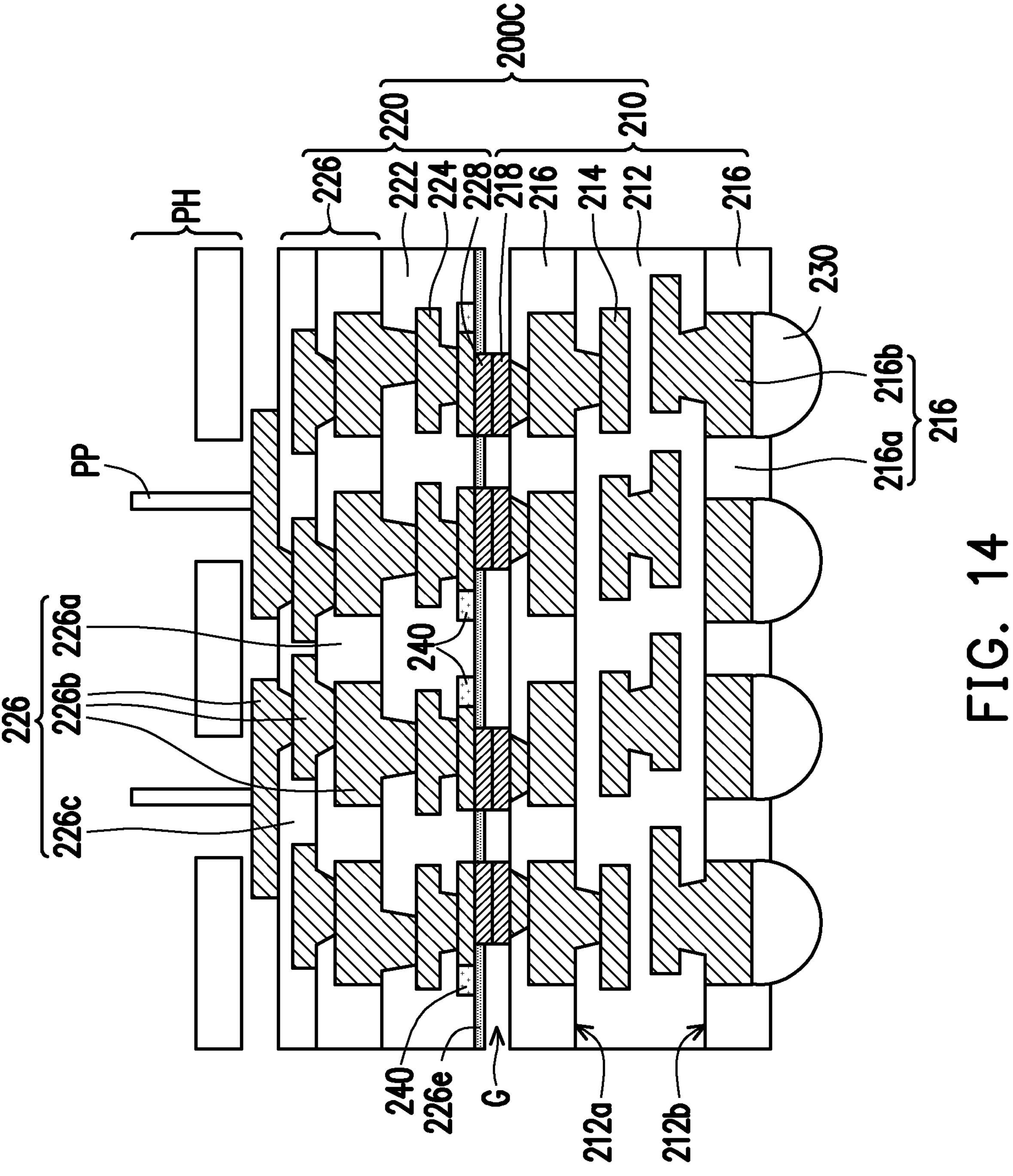

Referring to FIG. 14, a stacked wiring structure 200C of this embodiment is similar to the stacked wiring structure 200B of the thirteenth embodiment, but the main differences between the two are: the stacked wiring structure 200C further includes a heater 240. The heater 240 is disposed in the second wiring substrate 220.

The Fifteenth Embodiment

Figure 15:
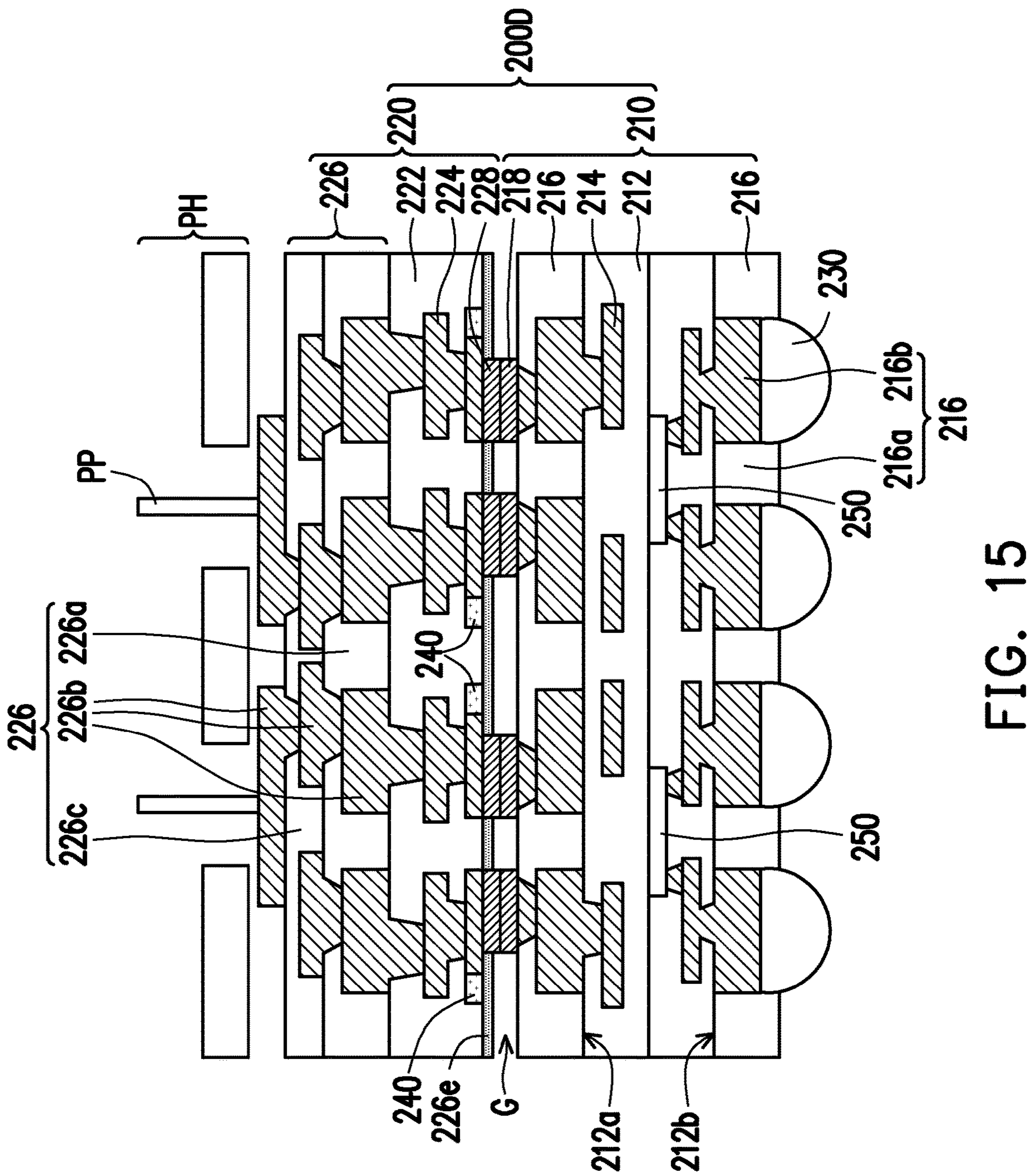

Referring to FIG. 15, a stacked wiring structure 200D of this embodiment is similar to the stacked wiring structure 200C of the fourteenth embodiment, but the main differences between the two are: the stacked wiring structure 200D further includes a passive device 250. The passive device 250 is disposed in the first wiring substrate 210. The circuit layout of the conducting wires 214 in the organic substrate 212 is changed according to the configuration of the passive device 250. As shown in FIG. 15, the passive device 250 may be embedded in the organic substrate 212. In this embodiment, the passive device 250 includes an integrated passive device (IPD) distributed in the organic substrate 212 near the first outer surface 212*b* of the organic substrate 212. In addition, the passive device 250 and the heater 240 are respectively disposed in the first wiring substrate 210 and the second wiring substrate 220.

The Sixteenth Embodiment

Figure 16:
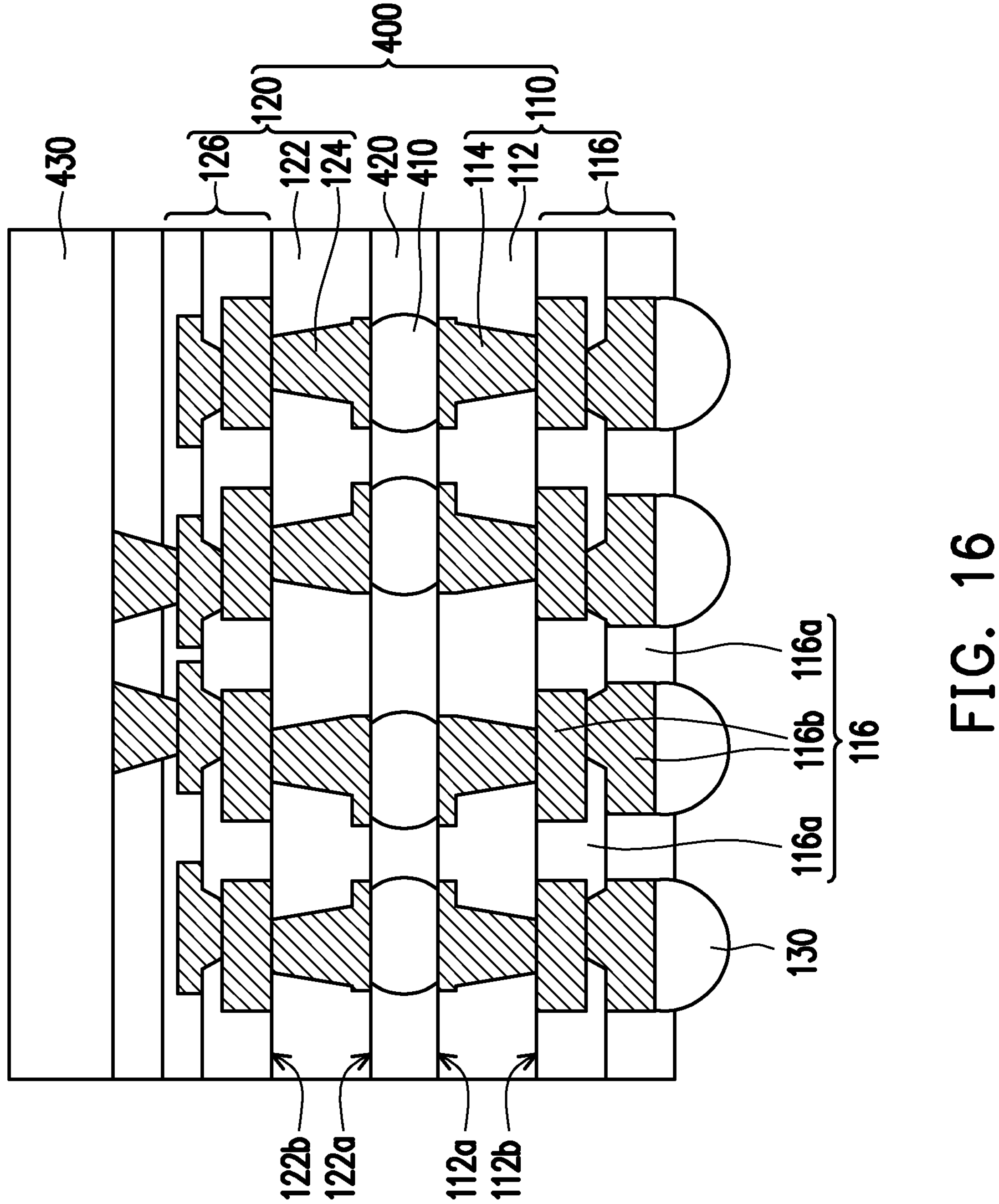

Referring to FIG. 16, a stacked wiring structure 400 of this embodiment is similar to the stacked wiring structure 100A of the first embodiment, but the main differences between the two are: the stacked wiring structure 400 further includes multiple solder balls 410. The solder balls 410 are disposed in the gap G between the first conductive through vias 114 and the second conductive through vias 124. The solder balls 410 are electrically connected between the first conductive through vias 114 and the second conductive through vias 124. The stacked wiring structure 400 does not include the first pads 118 and the second pads 128 as shown in FIG. 1. In addition, the stacked wiring structure 400 further includes an underfill material layer 420 filled in the gap G and/or an organic covering layer 430 covering the second multi-layered redistribution wiring structure 126. The aforementioned organic covering layer 430 may be used to protect the second multi-layered redistribution wiring structure 126 from being damaged during the manufacturing process.

In the aforementioned first embodiment to the sixteenth embodiment, the manufacture of the conductive through vias 114, 124, 224 and the conducting wires 214 is performed after the manufacture of the redistribution wiring structures 116, 126, 216, 226. In other words, the conductive through vias 114, 124, 224 and the conducting wires 214 are formed on the glass substrate 112, the glass substrate 122, the glass substrate 222, and the organic substrate 212, respectively, which already have the redistribution wiring structures 116, 126, 216, and 226. To sum up, the stacked wiring structure provided by some of the embodiments of the disclosure has a dual-layer glass wiring structure, which may be effectively applied in transparent antennas, AiP, advanced probe cards, and high-level integrated circuit packaging. Furthermore, the manufacture of the stacked wiring structure may be efficiently carried out using the production lines and process technologies of panel manufacturers. In addition, the stacked wiring structure provided by the embodiment of the disclosure has advantages such as low manufacturing cost, excellent flatness, and good heat dissipation. These characteristics are highly beneficial for applications in industries such as transparent antennas, AiP, advanced probe cards, and high-level integrated circuit packaging.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A stacked wiring structure, comprising:

a first wiring substrate, comprising a first glass substrate, a plurality of first conductive through vias penetrating through the first glass substrate, and a first multi-layered redistribution wiring structure disposed on the first glass substrate; and a second wiring substrate, comprising a second glass substrate, a plurality of second conductive through vias penetrating through the second glass substrate, and a second multi-layered redistribution wiring structure disposed on the second glass substrate, wherein the first conductive through vias are electrically connected to the second conductive through vias, the first glass substrate is spaced apart from the second glass substrate, and the first multi-layered redistribution wiring structure is spaced apart from the second multi-layered redistribution wiring structure by the first glass substrate and the second glass substrate, wherein the first multi-layered redistribution wiring structure further comprises a first stress control layer, and the first stress control layer is disposed on the first glass substrate, in the first multi-layered redistribution wiring structure and/or on the first multi-layered redistribution wiring structure, and the second multi-layered redistribution wiring structure further comprises a second stress control layer, and the second stress control layer is disposed on the second glass substrate, in the second multi-layered redistribution wiring structure and/or on the second multi-layered redistribution wiring structure.

2. The stacked wiring structure according to claim 1, wherein the first wiring substrate further comprises a plurality of first pads, the second wiring substrate further comprises a plurality of second pads, and the first pads are connected to the second pads, so that the first glass substrate is spaced apart from the second glass substrate by a gap.

3. The stacked wiring structure according to claim 1, wherein the first multi-layered redistribution wiring structure comprises a plurality of first dielectric layers and a plurality of first redistribution conducting wires between the first dielectric layers, and the second multi-layered redistribution wiring structure comprises at least one second dielectric layer, a plurality of second redistribution conducting wires, and a flat layer covering the first dielectric layers and the first redistribution conducting wires.

4. The stacked wiring structure according to claim 3, wherein the first multi-layered redistribution wiring structure further comprises a first etch stop layer, the first etch stop layer is disposed between the first dielectric layers and the first glass substrate, the second multi-layered redistribution wiring structure further comprises a second etch stop layer, and the second etch stop layer is disposed between the second dielectric layers and the second glass substrate.

5. The stacked wiring structure according to claim 3, further comprising:

a control chip, disposed on the second multi-layered redistribution wiring structure, wherein the first multi-layered redistribution wiring structure further comprises an antenna, and the antenna is disposed between the first dielectric layers.

6. The stacked wiring structure according to claim 1, wherein the first stress control layer is spaced apart from the second stress control layer.

7. The stacked wiring structure according to claim 1, further comprising a heater, wherein the heater is disposed in the first wiring substrate.

8. The stacked wiring structure according to claim 1, further comprising a passive device, wherein the passive device is disposed in the first wiring substrate.

9. The stacked wiring structure according to claim 1, further comprising a plurality of solder balls, wherein the solder balls are electrically connected between the first conductive through vias and the second conductive through vias, so that the first glass substrate is spaced apart from the second glass substrate by a gap.

10. A stacked wiring structure, comprising:

a first wiring substrate, comprising an organic substrate, a plurality of conducting wires penetrating through the organic substrate, and a first multi-layered redistribution wiring structure disposed on the organic substrate; and a second wiring substrate, comprising a glass substrate, a plurality of conductive through vias penetrating through the glass substrate, and a second multi-layered redistribution wiring structure disposed on the glass substrate, wherein the conducting wires are electrically connected to the conductive through vias, and the organic substrate is spaced apart from the glass substrate, wherein the second multi-layered redistribution wiring structure further comprises a stress control layer disposed on a surface of the glass substrate, and the surface of the glass substrate where the stress control layer faces the first wiring substrate.

11. The stacked wiring structure according to claim 10, further comprising a probe head with a probe, wherein the probe head is disposed above the second wiring substrate.

12. The stacked wiring structure according to claim 10, wherein the first wiring substrate further comprises a plurality of first pads, the second wiring substrate further comprises a plurality of second pads, and the first pads are connected to the second pads, so that the organic substrate is spaced apart from the glass substrate by a gap.

13. The stacked wiring structure according to claim 10, wherein the first multi-layered redistribution wiring structure comprises at least one first dielectric layer and a plurality of first redistribution conducting wires.

14. The stacked wiring structure according to claim 10, wherein the stress control layer comprises a silicon oxide layer, a silicon nitride layer, a silicon oxynitride layer, an aluminum oxide layer, or a magnesium oxide layer.

15. The stacked wiring structure according to claim 10, further comprising a heater, wherein the heater is disposed in the second wiring substrate.

16. The stacked wiring structure according to claim 10, further comprising a passive device, wherein the passive device is disposed in the first wiring substrate.

* * * * *